United States Patent
Lu et al.

(10) Patent No.: US 9,064,788 B1
(45) Date of Patent: Jun. 23, 2015

(54) STATISTICAL METHOD FOR MONITORING MANUFACTURING EQUIPMENT AND PROCESSING OPERATIONS

(71) Applicant: WaferTech, LLC, Camas, WA (US)

(72) Inventors: Liwen Lu, Camas, WA (US); Shih-Tzung Chang, Camas, WA (US)

(73) Assignee: WAFERTECH, LLC, Camas, WA (US)

(*) Notice: Subject to any disclaimer, the term of this patent is extended or adjusted under 35 U.S.C. 154(b) by 0 days.

(21) Appl. No.: 14/183,915

(22) Filed: Feb. 19, 2014

(51) Int. Cl.
| | | |
|---|---|---|
| *H01L 21/00* | (2006.01) | |
| *G01R 31/26* | (2014.01) | |
| *H01L 21/302* | (2006.01) | |
| *H01L 21/461* | (2006.01) | |
| *H01L 21/66* | (2006.01) | |
| *H01L 21/3205* | (2006.01) | |

(52) U.S. Cl.
CPC ............. *H01L 22/20* (2013.01); *H01L 22/12* (2013.01); *H01L 21/32051* (2013.01)

(58) Field of Classification Search
USPC ............ 438/7, 11, 14, 716; 257/E21.452, 257/E21.525, E21.21, E21.334
See application file for complete search history.

(56) References Cited

U.S. PATENT DOCUMENTS

| | | | |
|---|---|---|---|
| 6,148,246 A * | 11/2000 | Kawazome | 700/121 |
| 2003/0045960 A1* | 3/2003 | Yamamoto et al. | 700/121 |

* cited by examiner

*Primary Examiner* — Mohsen Ahmadi
(74) *Attorney, Agent, or Firm* — Duane Morris LLP

(57) ABSTRACT

A statistical process control method for monitoring and controlling semiconductor manufacturing processing operations is provided. For a chosen processing operation, multiple measurement sites are used to generate data of a measurable characteristic that is impacted by and associated with the processing operation. The data from the sites is compared over time and one or more outlier sites are identified. The outlier sites are the sites at which the data values are most divergent from the rest of the data. Algorithms are used to mathematically compare the outlier sites to the other sites to produce a comparative index. The comparative index is monitored graphically or otherwise to identify changes in the processing operation, and corrective actions are taken.

15 Claims, 6 Drawing Sheets

STATISTICAL METHOD FOR MONITORING MANUFACTURING EQUIPMENT AND PROCESSING OPERATIONS

TECHNICAL FIELD

The disclosure relates, most generally, to semiconductor device processing operations and, more particularly, to statistical methods for monitoring and controlling such processing operations.

BACKGROUND

Process controls are used in the semiconductor manufacturing world. Semiconductor devices are formed by a multitude of processing operations carried out upon a semiconductor or other substrate and each of the processing operations must be well controlled. The processing operations should exhibit run-to-run uniformity, i.e. process repeatability, and uniformity across the substrate being processed for each run. This is especially true in today's rapidly advancing semiconductor manufacturing industry in which device feature sizes are becoming smaller, the substrates upon which semiconductor devices are formed are becoming larger and a greater number of processing operations are used to form the semiconductor devices that are increasing in complexity. It is important for the millions of features that are simultaneously formed across the substrate to have the same dimensions and characteristics throughout the substrate each time a processing operation, i.e. run, is carried out.

This applies to various different types of processing operations such as thermal operations, deposition operations, coating operations, implantation operations, etching operations, epitaxial growth operations, polishing operations and various other operations used in semiconductor manufacturing.

It would therefore be advantageous to provide useful and reliable statistical process control techniques and methods.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
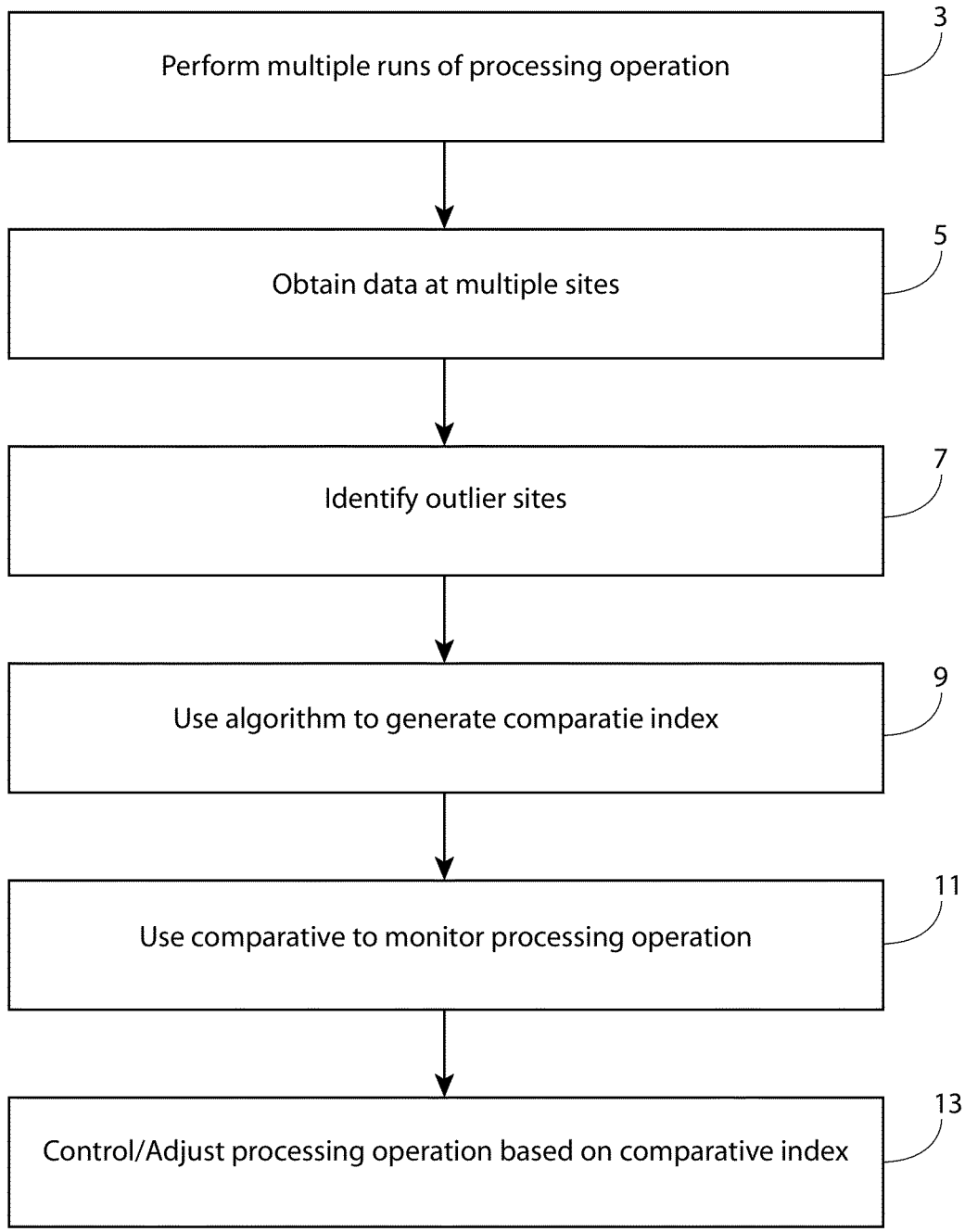
FIG. 1 is a flowchart illustrating a method according to an embodiment of the disclosure.

The disclosure relates to semiconductor device manufacturing and in particular to semiconductor processing operations carried out to form integrated circuits or other semiconductor devices upon semiconductor or other substrates using various processing tools. Embodiments of the disclosure provide useful and reliable statistical process control techniques and methods that can be applied to various processing operations and which provide both run-to-run uniformity and within run uniformity information in which the statistical process control data can be utilized to monitor and control semiconductor processing operations. The disclosure finds application in various semiconductor manufacturing process operations or processing tools in which the process operation is carried out upon a substrate and has an impact on the substrate that can be measured. Various embodiments of the disclosure provide for statistical analysis and monitoring and statistical process control of the semiconductor processing operations.

The processing operation and processing tool are characterized by carrying out a number of processing operations, also referred to as "runs". For each run, data is collected from the processing operations at a number of sites on the substrate being processed. The sites are chosen to be spread out at different locations on the substrate in order to be representative of a characteristic of the processing operation at various locations on the substrate. The data is monitored at each of the sites for numerous runs over time and the data is analyzed according to various methods of the disclosure. Corrective action is identified and undertaken based on the data analysis.

According to an embodiment, the processing operation is an ionized metal plasma (IMP) titanium (Ti) deposition process but the methods of the disclosure are applicable to other IMP deposition processes in other embodiments. In still other embodiments, the methods of the disclosure are applied to various other deposition processes, epitaxial growth processes, coating processes, implantation or other dopant processing operations or various semiconductor processing operations that have a measurable impact upon the substrate being processed.

A characteristic that is impacted by the processing operation is chosen for data recording and analysis. The processing operation has a measurable impact upon a characteristic of the substrate being processed. Various characteristics are used. In an embodiment, the characteristic is film thickness and the processing operation is a film deposition processing operation. In another embodiment, the characteristic associated with and impacted by a film deposition processing operation, is resistivity or sheet resistance. In other embodiments, other processing operations are the subject of the methods of the disclosure and the characteristic is resistivity, reflectivity, etching depth, amount of material removed, removal rate, dopant concentration, various critical dimensions, and various other characteristics that are measurable by various metrology tools used in semiconductor manufacturing. In still other embodiments, the characteristic is a parameter that is measured electronically by circuit testing. Device speed, signal-to-noise ratio, and various other characteristics that are tested at WAT (wafer acceptance test) or other electrical or diagnostic tests in which the parameter tested is associated with the performance of a processing operation. The data is collected by measuring the characteristic at the multiple measurement sites on a substrate over many runs and then analyzed according to methods and principles of the disclosure, and used to monitor, analyze and control the associated processing operation or operations.

FIG. 1 is a flow chart showing steps of a method according to an embodiment of the disclosure. At "Perform multiple runs of processing operation" step 3, various semiconductor processing operations are carried out multiple times. Various semiconductor manufacturing tools are used. In each run, one or multiple substrates is processed. The substrates being processed vary from about 100 millimeters to about 300 millimeters in diameter, in various embodiments. The processing operations include deposition operations such as PVD (physical vapor deposition), CVD (chemical vapor deposition), PECVD (plasma enhanced chemical vapor deposition), sputtering operations, epitaxial growth operations, and ionized metal plasma (IMP) deposition processes such as IMP titanium deposition processes. In other embodiments, the processing operation is used to deposit various materials such as AlCu, TiN, cobalt, CoTi, tungsten, aluminum, copper, and various other materials on a substrate. In other embodiments, the processing operation is a thermal operation such as a thermal growth operation or an annealing operation used to anneal a material, and in other embodiments, the processing operation is an etching or stripping operation. In various other embodiments, other processing operations such as low pressure TEOS (Tetraethly Orthosilicate) deposition, low pressure silicon nitride deposition, polysilicon deposition, CMP (chemical mechanical planarization), rapid thermal anneal operations and various photolithography operations, are the subject of the statistical methods of the disclosure.

At "Obtain data at multiple sites" step 5, data is obtained at each of multiple sites for each processing operation run. The data is obtained by measuring a measurable characteristic such as film thickness, resistance, sheet resistivity, specularity, film density, step height, dopant density, refractive index (RI), stress, K (extinction coefficient index), critical dimension (CD) or another characteristic impacted by and associated with the processing operation being analyzed. Various metrology or other measurement tools are used. The measurement method and tool are determined by the processing operation being analyzed and the characteristic associated with the processing operation that is being monitored and measured. Multiple sites on each substrate are measured. The sites are chosen to be spread out across the substrate.

Figure 2:
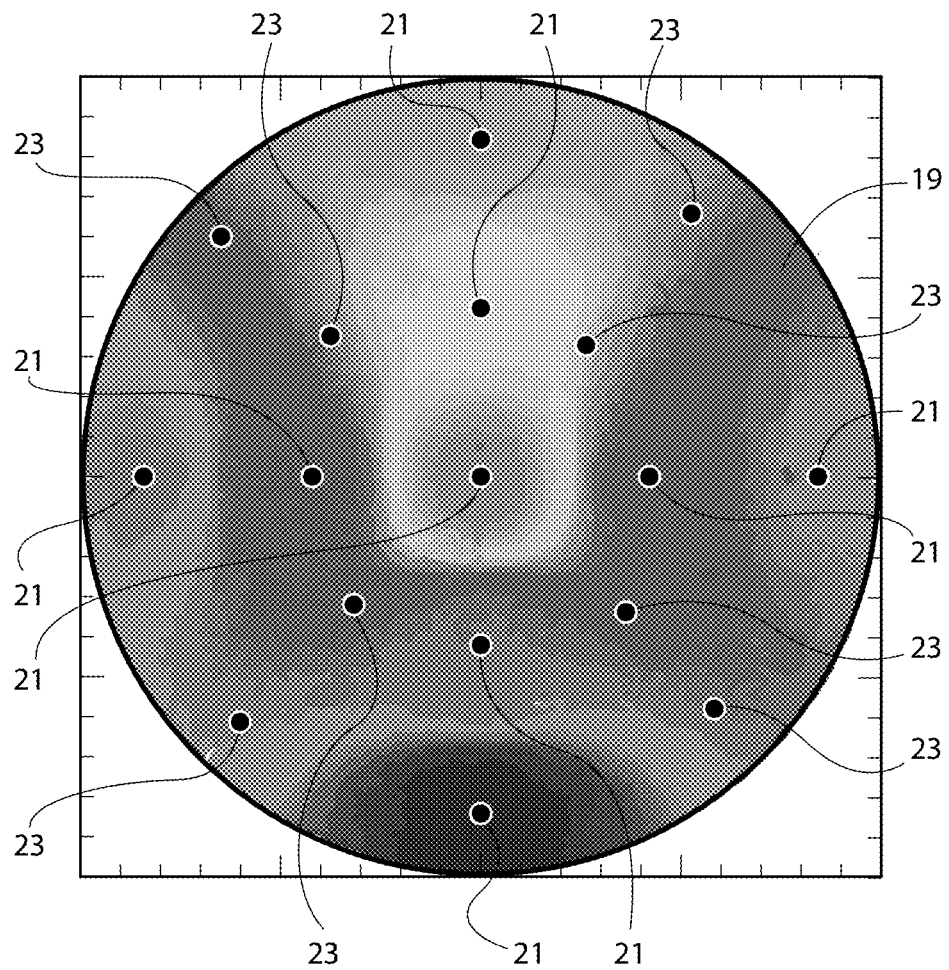
FIG. 2 shows embodiments of different numbers of sites that are measured according to various embodiments of the disclosure.

FIG. 2 shows substrate 19 with multiple measurement sites. In an embodiment, the nine measurement sites 21 are used for data collection and in another embodiment, a total of seventeen measurement sites including measurement sites 21 and 23, are used for data collection. According to each embodiment, data is obtained by measuring the value of a characteristic of the substrate at each of the measurement sites. The characteristics are as described above. The measurement sites, whether nine measurement sites 21 are used or seventeen measurement sites 21 and 23 are used, are chosen to be located at different positions throughout substrate 19 and represent different zones on substrate 19. In other embodiments, other numbers of measurement sites are used. The use of nine measurement sites 21 and seventeen measurement sites 21 and 23 represent two embodiments of the locations on a substrate used in semiconductor manufacturing that are used to provide data, but other numbers of measurement sites are used in other embodiments.

Returning to FIG. 1, at "Identify outlier site" step 7, an outlier site is identified. The data collected from each of the sites for each of the runs is analyzed and an outlier site is determined. The data is plotted or otherwise displayed, in some embodiments. The outlier site is the site that is most statistically distinguished from the other sites and will have the highest or lowest average value over the course of the processing operations studied. FIGS. 3A-3C and 4A-4C illustrate the step of identifying the outlier site and are discussed below. In some embodiments, one outlier site is identified and in other embodiments, two outlier sites are identified. In some embodiments, multiple outlier sites form a zone such as an annular zone on the substrate which is statistically distinguished from other portions of the substrate.

At "Use algorithms to generate comparative index" step 9, an algorithm is used to produce a comparative index which is a representation of a comparison between the data values at the outlier site and the other measurement sites. Various algorithms are used. Various characteristics are measured. The measured values of the characteristics are used in the algorithms. In an embodiment, the comparative index represents the measured value at the outlier site minus the average measured value of the other sites for each run. In another embodiment, the comparative index represents the measured value at the outlier site divided by the average of the measurement values of the other sites for each run. In still another embodiment, the comparative index represents the measured value at the outlier site minus the maximum measurement value obtained at the other sites for each run. In still another embodiment, the comparative index represents the measured value at the outlier site divided by the minimum measurement value obtained at the other sites for each run. According to another embodiment, the comparative index produced by the algorithm represents a specific profile, unique to the process operation. In some embodiments, the comparative index is plotted or otherwise displayed and in other embodiments, various techniques are used to present the comparative index associated with each run over several runs carried out over time.

Figure 5A:
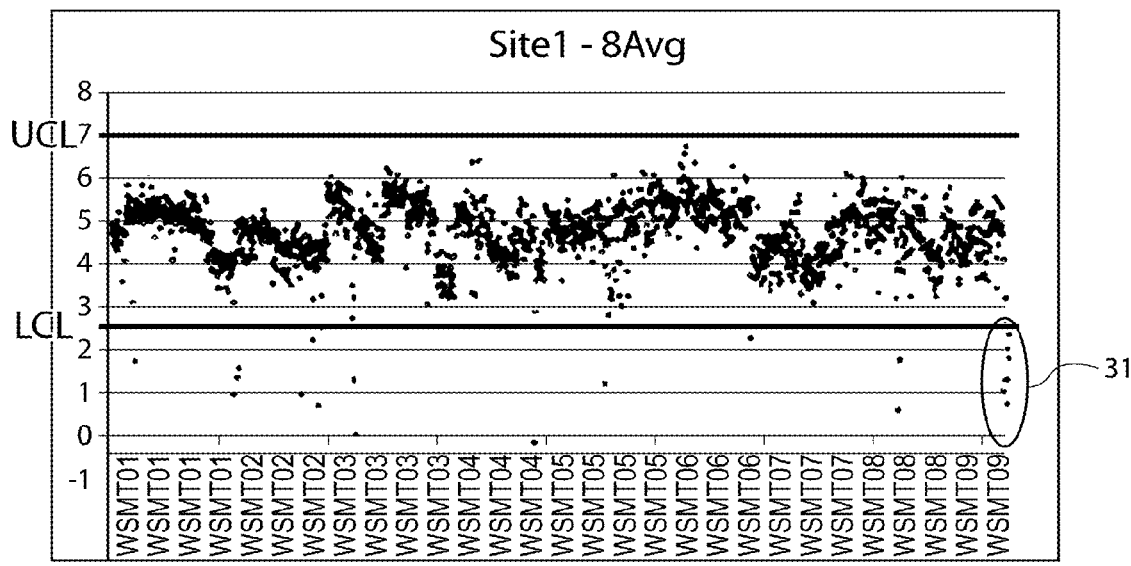
FIGS. 5A and 5B are graphical representations of the application of an algorithm for monitoring and controlling processes data according to some embodiments of the disclosure.
Figure 5B:
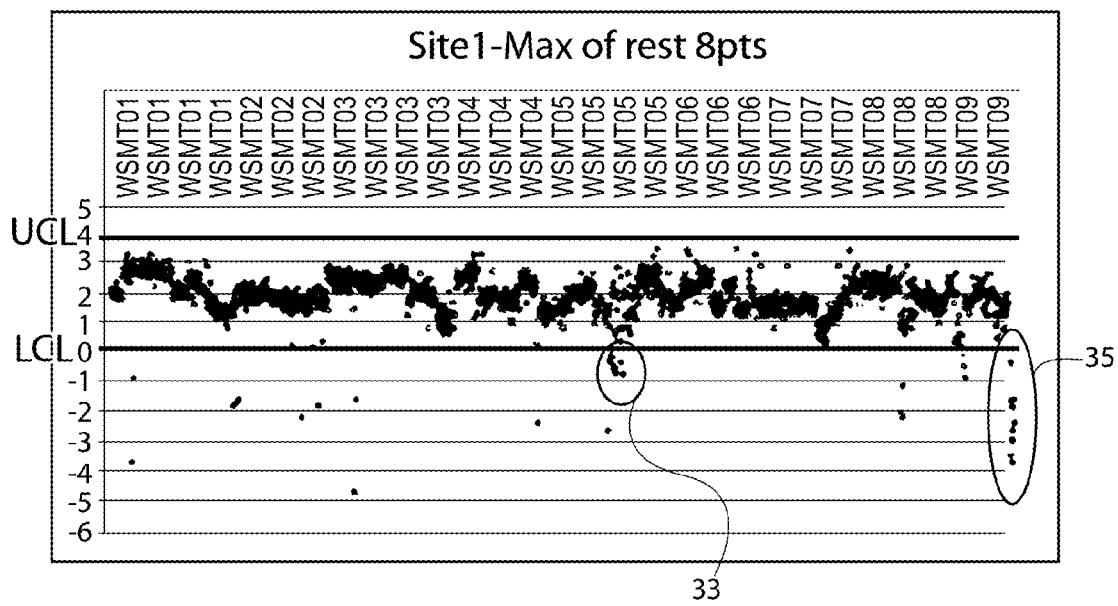

At "Use comparative index to monitor process operation" step 11, the comparative index is studied to monitor a process, e.g. to determine how a process is operating such as run-to-run repeatability. In some embodiments, the comparative index is graphed for each run and changes in the value of the comparative index are indicative of changes in the conditions of the processing operation. FIGS. 5A and 5B are graphs showing a plot of the comparative index according to various embodiments of the disclosure and will be described later.

At "Control/adjust processing operation based on comparative index" step 13, process control is carried out responsive to trends, changes or values in the comparative index. According to an embodiment, when the comparative index changes, various corrective or other actions are taken. In an embodiment, the corrective or other actions include adjusting parameters of the processing operation. In another embodiment, the actions include analyzing the cause of the change in the comparative index and in some cases this change is attributable to various factors such as equipment malfunction or other system changes. The process and equipment is investigated to assess the change in the comparative index and various further actions are taken.

Figure 3A:
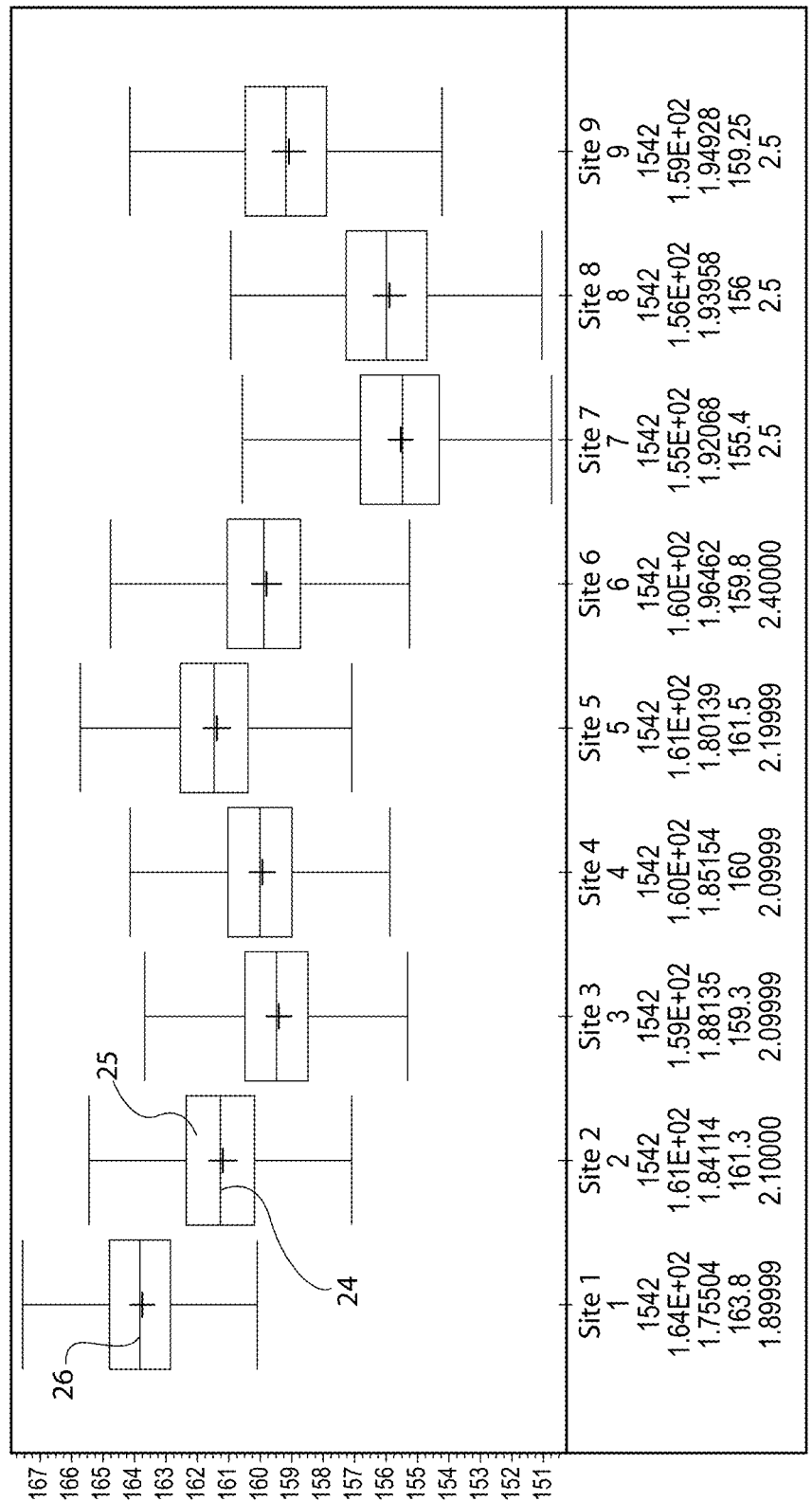
FIG. 3A is a box plot.
Figure 3B:
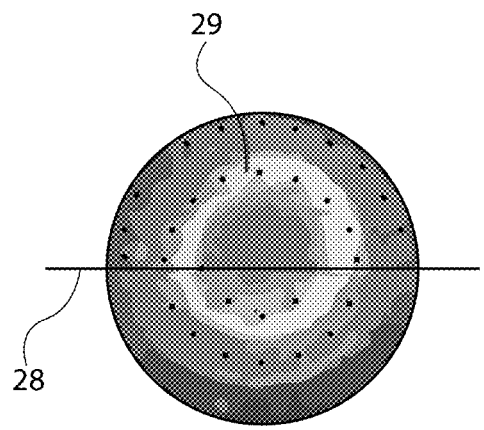
FIG. 3B is a plan view of a contour map and FIG. 3C is a side view of a contour map used to identify an outlier site on a substrate according to some embodiments of the disclosure.
Figure 3C:
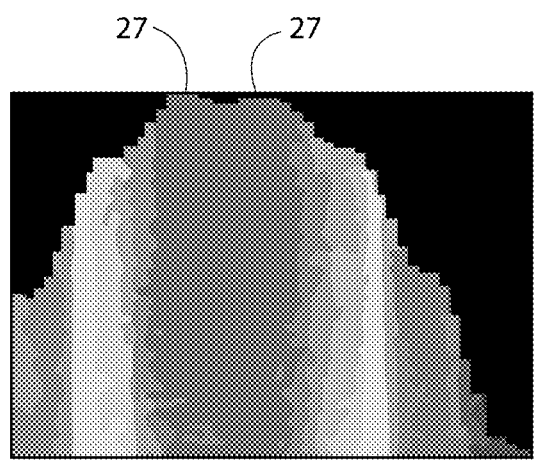

FIGS. 3A-3C show how an outlier site or outlier sites or zone of outlier sites, is determined. FIGS. 3A-3C represent a box plot and a contour plot of measured Ti thickness taken over time to establish and identify the outlier site. In other embodiments, the data analysis is collected for other measurable characteristics associated with, and impacted by a processing operation. FIG. 3A is a box plot showing measured thickness values of titanium in an IMP titanium deposition process. Sites 1 through 9 were measured on a corresponding processed substrate for each run over a series of processing operation runs and the average measured thickness at each of the sites is plotted in the box plot of FIG. 3A. Sites 1 through 9 appear along the x-axis and the values appearing along the x-axis and associated with each site, the average measured thickness at that site. The average measure thickness is the center line in the box that represents the data. At site 2 for example, the measured average thickness 24 is identified within box 25 representing the data at site 2. The outlier site is the site which has the most statistically divergent data, i.e. the most extreme deviation from the sample. The outlier site is a zone in some embodiments and is the zone with the most unique data within the wafer. The outlier site has the highest or lowest average value over the runs and represents the site whose average value is furthest distinguished from the average value of the other sites. The average measured thickness 26 at site 1 is greatest average thickness and is further distinguished from the average measured thickness at the other eight sites than the site with the lowest average thickness, identifying and establishing site 1 as the outlier site. In other embodiments, the outlier site that has a value furthest from the average of all the sites is a site with the lowest average value. As such, in various embodiments (not shown), the outlier site is the site with the lowest measured value over time.

FIG. 3B and FIG. 3C are both contour maps. FIG. 3B represents data measured over a number of runs with the average value plotted at various sites on a substrate. The different shading is used to identify the "hot spot" or outlier site having a value most distinguished from the other data. In other embodiments, other graphical display techniques are used to identify the outlier site. In FIG. 3C, a two-dimensional contour plot taken along a straight line along the surface of the substrate, identifies two outlier sites 27 which have values that are most distinguished from the data of the other sites. In an embodiment, the straight line is line 28 in FIG. 3B but the data exhibited in FIG. 3C is taken at various other lines that extend across the data plot shown in FIG. 3B. In FIG. 3C, the two outlier sites 27 represent the highest data value. In some embodiments, the two outlier sites 27 represent two points that are part of a ring such as ring 29 of light shaded data shown in FIG. 3B. and form a zone with the most unique, or statistically divergent data. In other embodiments, other annular or other shapes on the substrate surface form a zone with the most unique, or statistically divergent data.

Figure 4A:
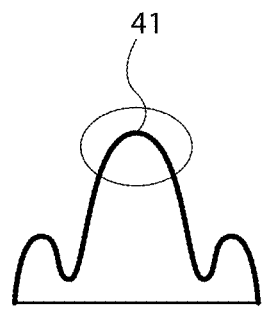
FIGS. 4A-4C shows three contour plots in which an outlier zone is identified according to some embodiments of the disclosure.
Figure 4B:
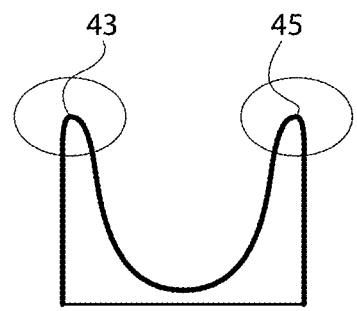
Figure 4C:
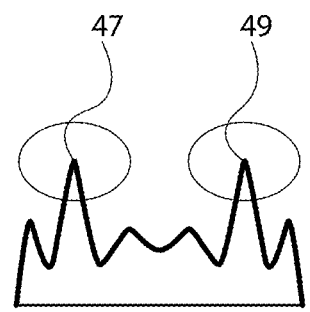

FIGS. 4A-4C are contour plots in which the value of the measured characteristic is plotted along the x direction along a direction on the surface of the substrate and are also known as cross-section plots. FIGS. 4A-4C are contour plots that are similar to the plot in FIG. 3C and represent data values taken along a straight line across a substrate. FIGS. 4A-4C are general data plots and can represent any measurable data such as thickness, in various embodiments. In one embodiment, FIGS. 4B-4C represent a contour plot (i.e. cross-section plot) representative of a single run or a contour plot with average data taken over a number of runs. FIG. 4A illustrates an embodiment in which a singular location 41 at the highest inflection point along the plot is identified as an outlier site. FIGS. 4B and 4C illustrate an embodiment in which two sites are identified as outlier sites and in some embodiments, the two outlier sites on FIGS. 4A-4C are indicative of a circular or annular zone on a substrate such as ring 29 shown in FIG. 3B. Outlier sites 43 and 45 are shown in FIG. 4B and outlier sites are shown in FIG. 4C. FIGS. 4A-4C present a graphical technique for identifying outlier sites with the highest or lowest inflection points.

FIGS. 5A and 5B are graphs in which a comparative index produced by an algorithm is plotted. After an outlier site is identified as above, a comparative index comparing the outlier sites to the other sites is generated using an algorithm, i.e. a mathematical relationship. When multiple outlier sites are identified, a comparative index comparing each of the outlier sites to the other sites is generated using an algorithm.

In an embodiment, the comparative index represents the value of the outlier site minus the average value of other sites for each run. In another embodiment, the comparative index represents the value of the outlier site divided by the average value of other sites for each particular run. In still another embodiment, the comparative index represents the value at the outlier site minus the maximum value of all the other data sites for each particular run. In still another embodiment, the comparative index represents the value at the outlier site minus the minimum value of all the other data sites for each run. The preceding are algorithms used in various embodiments, but other algorithms are used in other embodiments to produce other comparative indices that are plotted for each run, such as in FIGS. 5A and 5B. The data, i.e. comparative index, is plotted for each run and monitored over time to monitor the repeatability of the process. When changes in the data are noted, the causes of the change are identified and various adjustments are made and/or corrective actions taken. In some embodiments, the actions include troubleshooting the processing tool and/or changing the parameters of the processing operation to restore the comparative index to its previous level.

FIG. 5A shows an embodiment in which an algorithm is used to generate a comparative index representative of the value (shown on the y axis) of "site 1" minus the average value of the other 8 sites for an embodiment in which 9 measurement sites are used. The x axis represents processing operations carried out over time. Statistical process control methods are used to generate upper control limits and lower control limits based on the plotted comparative index data. Various statistical process control methods for determining control limits are available and are used in various embodiments. The control limits are also displayed in FIG. 5A. Data points in circled region 31 lie outside the zone identified by the upper control limit UCL and lower control limit LCL indicating that the comparative index has changed relative to its historical levels and indicates a change in the processing operation. In some embodiments, action is taken to correct the changes and identify the cause of the change in the comparative index.

In some embodiments, each individual data point represents the comparative index generated by measurements at multiple measurement sites on a single substrate, but in other embodiments, each individual data point represents other sample sizes. In some embodiments, each individual data point is generated based on averages of the data obtained from multiple substrates processed in sequence in a single continuous event.

FIG. 5B is a graph plotting the comparative index representative of the value at the outlier site ("site 1") minus the maximum value of the other 8 data points according to an embodiment in which 9 measurement sites are used. Various statistical process control techniques are used to establish lower control limits LCL and upper control limits UCL which are displayed in FIG. 5B. FIG. 5B shows at least two instances in which the comparative index is trending outside of the control limits. The data points in circled regions 33 and 35 are each indicative of a change in the processing conditions, as reflected by a change in the plotted comparative index. In each case, the out-of-control data alerts personnel to identify the cause of the change and to take appropriate action to restore the comparative index to its historical, controlled levels.

According to one aspect, a method for monitoring a manufacturing operation is provided. The method comprises: performing multiple runs of a processing operation upon semiconductor substrates over time, the processing operation having a measurable impact on a characteristic of the semiconductor substrate; measuring the characteristic at a plurality of sites on the corresponding semiconductor substrate for each the run; identifying an outlier site of the plurality of sites wherein the measured characteristic has the largest or smallest average value over the runs; and generating a comparative index comparing a value of the measured characteristics of the outlier site to a value of the measured characteristics of other sites of the plurality of sites, for each the run.

In some embodiments, the method further comprises adjusting parameters of the processing operation based upon the comparative index.

In some embodiments, the method further comprises performing further runs of the processing operation and measuring the characteristic at the outlier site and at the other sites for each the further run; and generating the comparative index for each the further run and monitoring the comparative index in time.

In some embodiments, the method further comprises controlling the processing operation by adjusting a parameter thereof based on changes in the comparative index.

In some embodiments, the comparative index represents the value of the measured characteristic of the outlier site minus an average value of the measured characteristic of the other sites.

In some embodiments, the comparative index represents the value of the measured characteristic of the outlier site divided by an average value of the measured characteristic of the other sites.

In some embodiments, the comparative index represents the value of the measured characteristic of the outlier site minus a maximum value of the measured characteristics of the other sites, for each the run.

In some embodiments, the processing operation comprises an ionized metal plasma (IMP) deposition operation and the characteristic comprises film thickness.

In some embodiments, the plurality of sites comprise nine or seventeen sites and the characteristic comprises resistivity.

According to one aspect, a method for monitoring a manufacturing operation is provided. The method comprises performing multiple runs of a processing operation upon semiconductor substrates over time, the processing operation having a measurable impact on a characteristic; measuring the characteristic at a plurality of sites on the corresponding semiconductor substrate for each the run; identifying one or more outlier sites of the plurality of sites with the most statistically divergent data of the measured characteristic over the runs; and generating a comparative index comparing a value of the measured characteristics of each of the one or more outlier sites to a value of the measured characteristics of other sites of the plurality of sites, for each the run.

In some embodiments, the one or more outlier sites comprise an annular zone on the substrates.

In some embodiments, the comparative index represents one of: the value of the measured characteristic of each of the one or more outlier sites minus an average value of the measured characteristic of the other sites; and the value of the measured characteristic of each of the one or more outlier sites divided by an average value of the measured characteristic of the other sites.

According to one aspect, a method for monitoring a manufacturing operation, is provided. The method comprises performing multiple runs of a processing operation upon semiconductor substrates over time, the processing operation having a measurable impact on a characteristic. The method also includes measuring the characteristic at a plurality of sites on the corresponding semiconductor substrate for each the run; identifying an outlier site of the plurality of sites in which the measured characteristic has the largest or smallest average value over the runs; performing further runs of the processing operation on further semiconductor substrates and measuring the characteristic at the outlier site and at other sites of the plurality of sites on the corresponding further semiconductor substrate, for each the further run; and comparing a value of the measured characteristic of the outlier site to a value of the measured characteristic of the other sites of each the further run, to control the processing operation.

In some embodiments, the comparing comprises mathematically comparing using an algorithm and further comprising controlling the processing operation by adjusting a parameter thereof based on the comparing.

In some embodiments, the comparing produces a comparative index that comprises the value of the measured characteristic of the outlier site to the value of the measured characteristic of the other sites and wherein the comparing includes monitoring the comparative index over time.

In some embodiments, the method further comprises adjusting the processing operation by adjusting at least one parameter of the processing operation based on the change when the comparative index changes.

In some embodiments, the comparative index represents the value of the measured characteristic of the outlier site minus an average value of the measured characteristic of the other sites.

In some embodiments, the comparative index represents the value of the measured characteristic of the outlier site divided by an average value of the measured characteristic of the other sites.

In some embodiments, the comparing produces a comparative index that represents the value of the measured characteristic of the outlier site minus a maximum value of the values of the measured characteristic of the other sites and wherein the comparing comprises monitoring the comparative index over time.

In some embodiments, the processing operation comprises an ionized metal plasma (IMP) deposition operation and the characteristic comprises film thickness.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for monitoring a manufacturing operation, said method comprising:
   performing multiple runs of a processing operation upon semiconductor substrates over time, said processing operation having a measurable impact on a characteristic of said semiconductor substrate;
   measuring said characteristic at a plurality of sites on said corresponding semiconductor substrate for each said run;
   identifying an outlier site of said plurality of sites wherein said measured characteristic has the largest or smallest average value over said runs;
   generating a comparative index comparing a value of said measured characteristics of said outlier site to a value of said measured characteristics of other sites of said plurality of sites, for each said run;
   performing further runs of said processing operation and measuring said characteristic at said outlier site and at said other sites for each said further run; and generating said comparative index for each said further run and monitoring said comparative index in time; and
   controlling said processing operation by adjusting a parameter thereof based on changes in said comparative index.

2. The method as in claim 1, further comprising adjusting parameters of said processing operation based upon said comparative index.

3. The method as in claim 1, wherein said comparative index represents said value of said measured characteristic of said outlier site minus an average value of said measured characteristic of said other sites.

4. The method as in claim 1, wherein said comparative index represents said value of said measured characteristic of said outlier site divided by an average value of said measured characteristic of said other sites.

5. The method as in claim 1, wherein said comparative index represents said value of said measured characteristic of said outlier site minus a maximum value of said measured characteristics of said other sites, for each said run.

6. The method as in claim 1, wherein said processing operation comprises an ionized metal plasma (IMP) deposition operation and said characteristic comprises film thickness.

7. The method as in claim 1, wherein said plurality of sites comprise nine or seventeen sites and said characteristic comprises resistivity.

8. A method for monitoring a manufacturing operation, said method comprising:
   performing multiple runs of a processing operation upon semiconductor substrates over time, said processing operation having a measurable impact on a characteristic of said semiconductor substrate;
   measuring said characteristic at a plurality of sites on said corresponding semiconductor substrate for each said run;
   identifying one or more outlier sites of said plurality of sites with the most statistically divergent data of said measured characteristic over said runs; and
   generating a comparative index comparing a value of said measured characteristics of each of said one or more outlier sites to a value of said measured characteristics of other sites of said plurality of sites, for each said run;
   wherein said one or more outlier sites comprise an annular zone on said substrates;
   wherein said comparative index represents one of:
   said value of said measured characteristic of each of said one or more outlier sites minus an average value of said measured characteristic of said other sites; and
   said value of said measured characteristic of each of said one or more outlier sites divided by an average value of said measured characteristic of said other sites.

9. A method for monitoring a manufacturing operation, said method comprising:
   performing multiple runs of a processing operation upon semiconductor substrates over time, said processing operation having a measurable impact on a characteristic;
   measuring said characteristic at a plurality of sites on said corresponding semiconductor substrate for each said run;
   identifying an outlier site of said plurality of sites in which said measured characteristic has the largest or smallest average value over said runs;
   performing further runs of said processing operation on further semiconductor substrates and measuring said characteristic at said outlier site and at other sites of said plurality of sites on said corresponding further semiconductor substrate, for each said further run; and
   comparing a value of said measured characteristic of said outlier site to a value of said measured characteristic of said other sites of each said further run, to control said processing operation;
   wherein said comparing produces a comparative index that comprises said value of said measured characteristic of said outlier site to said value of said measured characteristic of said other sites and wherein said comparing includes monitoring said comparative index over time.

10. The method as in claim 9, wherein said comparing comprises mathematically comparing and further comprising controlling said processing operation by adjusting a parameter thereof based on said comparing.

11. The method as in claim 9, further comprising adjusting said processing operation by adjusting at least one parameter of said processing operation based on a change of said comparative index.

12. The method as in claim 9, wherein said comparative index represents said value of said measured characteristic of said outlier site minus an average value of said measured characteristic of said other sites.

13. The method as in claim 9, wherein said comparative index represents said value of said measured characteristic of said outlier site divided by an average value of said measured characteristic of said other sites.

14. The method as in claim 9, wherein said comparing produces a comparative index that represents said value of said measured characteristic of said outlier site minus a maximum value of said values of said measured characteristic of said other sites and wherein said comparing comprises monitoring said comparative index over time.

15. The method as in claim 9, wherein said processing operation comprises an ionized metal plasma (IMP) deposition operation and said characteristic comprises film thickness.

* * * * *

UNITED STATES PATENT AND TRADEMARK OFFICE
CERTIFICATE OF CORRECTION

PATENT NO.          : 9,064,788 B1                                Page 1 of 1
APPLICATION NO.     : 14/183915
DATED               : June 23, 2015
INVENTOR(S)         : Lu et al.

It is certified that error appears in the above-identified patent and that said Letters Patent is hereby corrected as shown below:

In the drawings

Figure 1, box 4, replace "Use algorithm to generate comparatie index" with --Use algorithm to generate comparative index--

Figure 1, box 5, replace "Use comparative to monitor processing operation" with --Use comparative index to monitor processing operation--

Signed and Sealed this
Seventeenth Day of May, 2016

Michelle K. Lee
*Director of the United States Patent and Trademark Office*